United States Patent
Zhang et al.

(10) Patent No.: US 10,567,084 B2
(45) Date of Patent: Feb. 18, 2020

(54) THERMAL INTERFACE STRUCTURE FOR OPTICAL TRANSCEIVER MODULES

(71) Applicant: Honeywell International Inc., Morris Plains, NJ (US)

(72) Inventors: Kai Zhang, Shanghai (CN); Ling Shen, Shanghai (CN); Liqiang Zhang, Shanghai (CN); Ya Qun Liu, Shanghai (CN); Limei Cui, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/134,139

(22) Filed: Sep. 18, 2018

(65) Prior Publication Data

US 2019/0190605 A1 Jun. 20, 2019

Related U.S. Application Data

(60) Provisional application No. 62/599,990, filed on Dec. 18, 2017.

(51) Int. Cl.
| | |
|---|---|
| *H04B 1/38* | (2015.01) |
| *H04B 10/40* | (2013.01) |
| *H05K 7/20* | (2006.01) |
| *G06F 1/20* | (2006.01) |
| *H04B 1/036* | (2006.01) |

(52) U.S. Cl.
CPC ............ *H04B 10/40* (2013.01); *G06F 1/206* (2013.01); *H04B 1/036* (2013.01); *H04B 1/38* (2013.01); *H05K 7/2039* (2013.01)

(58) Field of Classification Search
CPC combination set(s) only.
See application file for complete search history.

(56) References Cited

U.S. PATENT DOCUMENTS

| | | |
|---|---|---|
| 3,536,796 A | 10/1970 | Rock |
| 5,479,952 A | 1/1996 | Zachariades et al. |
| 5,607,518 A | 3/1997 | Hoffman et al. |
| 8,535,787 B1 | 9/2013 | Lima |
| 9,138,506 B2 | 9/2015 | Aben et al. |

(Continued)

FOREIGN PATENT DOCUMENTS

| | | |
|---|---|---|
| CN | 1613907 A | 5/2005 |
| JP | H1017672 A | 1/1998 |

(Continued)

OTHER PUBLICATIONS

International Search Report and Written Opinion issued in PCT/US2018/066017, dated Apr. 10, 2019, 9 pages.

*Primary Examiner* — Omar S Ismail
(74) *Attorney, Agent, or Firm* — Faegre Baker Daniels LLP

(57) ABSTRACT

A thermal interface structure for electronic devices, such as telecommunications or data networking hardware, that utilize optical transceiver modules which are inserted within cage receptacles of the electronic devices. In order to provide for efficient heat transfer, the thermal interface structure is disposed between, and in abutment with, the optical transceiver module and a heat sink associated with the cage receptacle. The thermal interface structure includes a thermal interface layer including a phase change material, and a polymer layer connected to the thermal interface layer.

19 Claims, 6 Drawing Sheets

(56) References Cited

U.S. PATENT DOCUMENTS

| | | | | |
|---|---|---|---|---|
| 2002/0159235 A1* | 10/2002 | Miller | ............... | G02B 6/4201 361/704 |
| 2003/0059176 A1* | 3/2003 | Chan | ............... | G02B 6/4201 385/92 |
| 2003/0128512 A1* | 7/2003 | Owens | ............... | G02B 6/293 361/689 |
| 2003/0193110 A1 | 10/2003 | Yaritz et al. | | |
| 2003/0201462 A1* | 10/2003 | Pommer | ............... | G02B 6/4201 257/200 |
| 2005/0239963 A1 | 10/2005 | Kitano et al. | | |
| 2006/0008643 A1* | 1/2006 | Lin | ............... | C08K 5/0016 428/364 |
| 2006/0014459 A1 | 1/2006 | Snijder et al. | | |
| 2006/0052534 A1 | 3/2006 | Suzuki et al. | | |
| 2006/0052543 A1 | 3/2006 | Mori et al. | | |
| 2006/0148945 A1 | 7/2006 | Schmitz et al. | | |
| 2007/0225431 A1 | 9/2007 | Mori et al. | | |
| 2007/0243618 A1* | 10/2007 | Hatchett | ............... | G01M 3/38 436/1 |
| 2008/0287990 A1 | 11/2008 | Smit | | |
| 2009/0011509 A1 | 1/2009 | Ahlroth et al. | | |
| 2010/0285094 A1 | 11/2010 | Gupta | | |
| 2011/0110048 A1* | 5/2011 | Lima | ............... | H05K 7/20418 361/720 |
| 2011/0222567 A1* | 9/2011 | Scofet | ............... | H01S 5/02212 372/36 |
| 2011/0317964 A1 | 12/2011 | Downs | | |
| 2012/0251057 A1 | 10/2012 | Yi et al. | | |
| 2012/0281365 A1 | 11/2012 | Lima | | |
| 2013/0265721 A1* | 10/2013 | Strader | ............... | H05K 7/2039 361/705 |
| 2014/0043754 A1* | 2/2014 | Hartmann | ............... | H05K 7/20454 361/679.54 |
| 2015/0334871 A1* | 11/2015 | Hill | ............... | H05K 7/2039 165/185 |
| 2016/0177083 A1 | 6/2016 | Jogo et al. | | |
| 2016/0242313 A1* | 8/2016 | Singh | ............... | H05K 1/184 |
| 2017/0090130 A1* | 3/2017 | Meadowcroft | ............... | G02B 6/425 |
| 2018/0206325 A1* | 7/2018 | McIntyre | ............... | H05K 7/205 |

FOREIGN PATENT DOCUMENTS

| | | |
|---|---|---|
| JP | 4998249 B2 | 7/2009 |
| KR | 20110032227 A | 3/2011 |
| TW | I540799 B | 5/2013 |
| WO | 2015132328 A2 | 9/2015 |
| WO | 2016198405 A1 | 12/2016 |

* cited by examiner

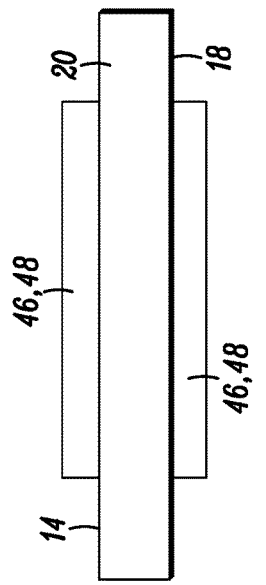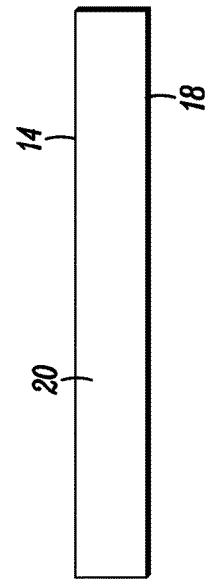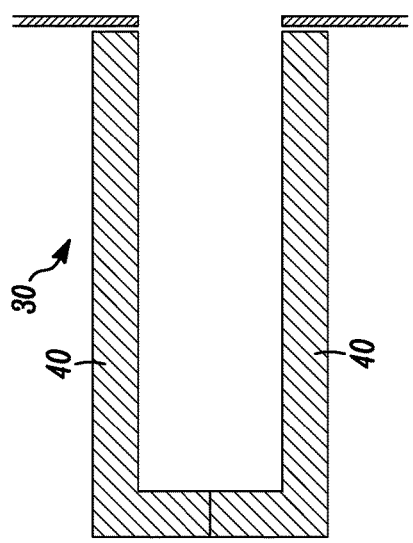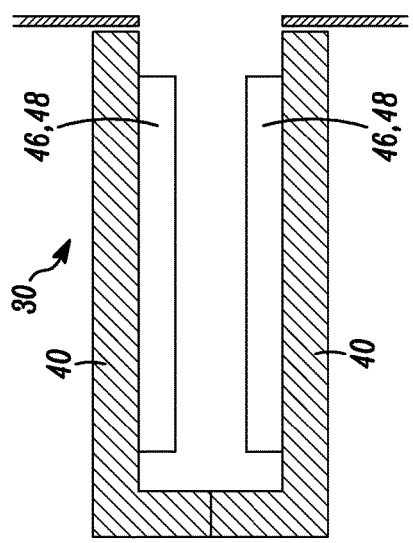
FIG. 4
FIG. 5

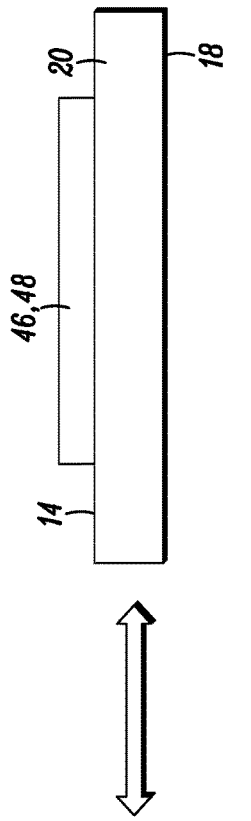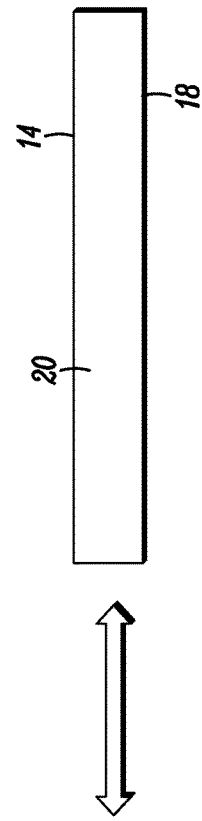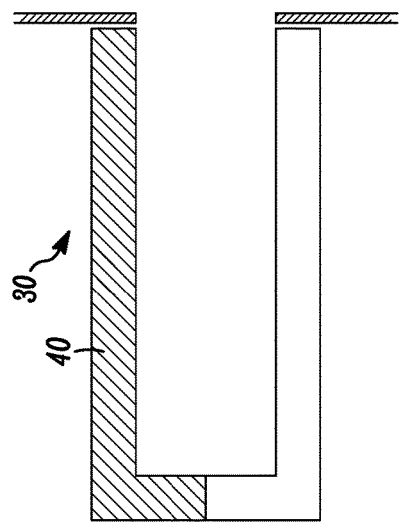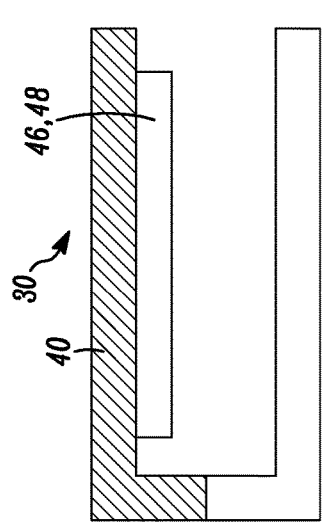
FIG. 6
FIG. 7

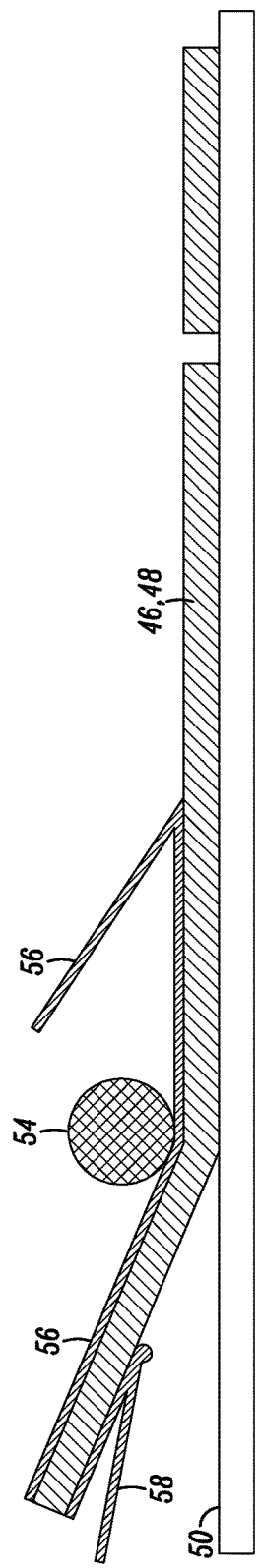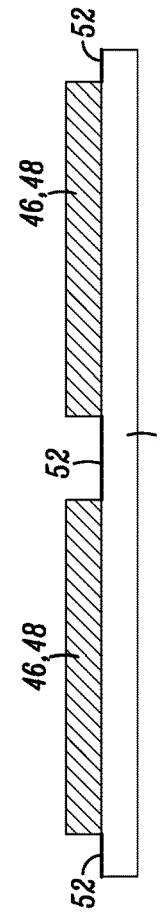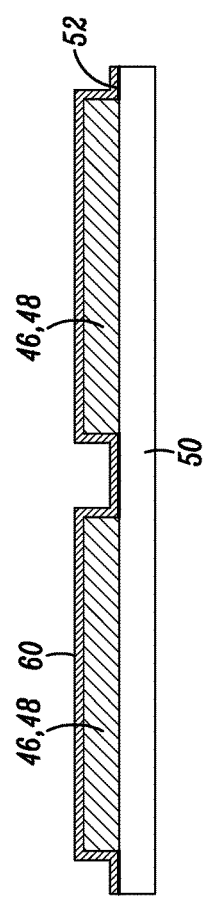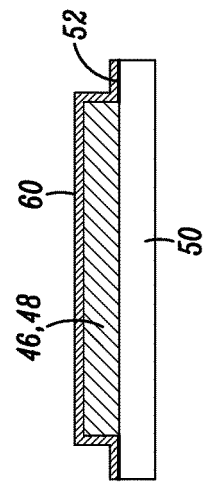
FIG. 8
FIG. 9
FIG. 10
FIG. 11

THERMAL INTERFACE STRUCTURE FOR OPTICAL TRANSCEIVER MODULES

CROSS-REFERENCE TO RELATED APPLICATIONS

This application claims the benefit under Title 35, U.S.C. § 119(e) of U.S. Provisional Patent Application Ser. No. 62/599,990, entitled THERMAL INTERFACE STRUCTURE FOR OPTICAL TRANSCEIVER MODULES, filed on Dec. 18, 2017, the disclosure of which is expressly incorporated by reference herein in its entirety.

BACKGROUND

1. Field of the Disclosure

The present disclosure relates to thermal interface structures which may be used to dissipate heat from optical transceiver modules.

2. Description of the Related Art

Optical transceiver modules are typically packaged as small form factor (SFF) or small form factor pluggable (SFFP) packages, such as XFP modules or other industry standard formats. Typically, an optical transceiver module is inserted within a cage receptacle of an electronics unit, such as a device of telecommunications/data networking hardware, with electrical contacts of the module engaging corresponding electrical contacts associated with the cage receptacle and the circuit board of the electronics unit to enable transmission of data.

In use, optical transceiver modules of 40G, 100G, 200G or even higher data transmission rates can generate a large amount of heat, which must be dissipated away from the module to ensure desired operating performance. Typically, the cage receptacle that receives the optical transceiver module includes a metal heat sink which contacts a wall of the optical transceiver module for heat dissipation. Problematically however, the quality of the metal-to-metal contact, or fit, is often imprecise, compromising the integrity of the thermal transfer contact between the transceiver module and the heat sink.

In another approach, a thermal interface material (TIM) in the form of a gel, for example, may be applied to an outer wall of the transceiver module, with the gel in contacting abutment with the heat sink when the transceiver module is received within the cage receptacle. However, known thermal interface gels tend to eventually dry out and harden, compromising the thermal transfer connection. Furthermore, repeated removal and insertion of the transceiver module into the cage receptacle can lead to deformation, marring, or removal of the thermal interface gel, further compromising thermal transfer.

Other thermal interface materials in the form of greases typically cannot be applied to a sufficient thickness to mitigate the interface gap variations between the cage receptacle and an inserted transceiver module. Still other thermal interface materials in the form of gap pads may generate residues, normally from the filler in the gap pad eroding from the surface of the gap pad during repeated insertion and removal of the transceiver module from the cage receptacle, and the residue may negatively affect the electrical contacts of the device. Further, both greases and gap pads are normally based on a silicone matrix, and silicone oil from the matrix may evaporate out of the matrix and also negatively affect the electrical contacts of the device.

What is needed is a thermal interface structure for optical transceiver modules which is an improvement over the foregoing.

SUMMARY

The present disclosure provides a thermal interface structure for electronic devices, such as telecommunications or data networking hardware, that utilize optical transceiver modules which are inserted within cage receptacles of the electronic devices. In order to provide for efficient heat transfer, the thermal interface structure is disposed between, and in abutment with, the optical transceiver module and a heat sink associated with the cage receptacle. The thermal interface structure includes a thermal interface layer including a phase change material, and a polymer layer connected to the thermal interface layer.

In one form thereof, the present disclosure provides an optical transceiver module, including a housing having an external wall; and a thermal interface structure connected to the external wall, the thermal interface structure including a thermal interface material including a phase change material, the thermal interface material having a first side and a second side, the first side connected to the external wall of the housing; and a polymer layer connected to the second side of the thermal interface material.

The housing may include a pair of opposite walls, each wall having a respective thermal interface structure connected thereto.

The thermal interface structure may additionally include an adhesive layer connecting the thermal interface material and the polymer layer.

The thermal interface material may additionally include a polymer matrix and at least one filler. The polymer layer may be formed of at least one polymer selected from the group consisting of polyester, polyimide, polysulfone, polycarbonate, polyamide, polyethylene terephthalate, polyethylene naphthalate, polybutylene terephthalate, polyvinylchloride, polylactic acid, polyurethane, polyacrylic, polyvinyl alcohol, polyethylene vinylacetate, polyethylene, polypropylene, polycyclopentadiene, polytetrafluoroethylene, polyvinylidene fluoride, polyvinyl fluoride, poly(ethylene-co-tetrafluoroethylene), poly(hexafluoropropylene-co-tetrafluoroethylene), polychlorotrifluoroethylene, polystyrene, polyether sulfone, polyether ether ketone, and combinations thereof. The polymer layer may have a thermal conductivity of at least 0.2 W/mK. The phase change material may have a melting point of 20° C. to 100° C.

In another form thereof, the present disclosure provides an electronic component, including a cage receptacle including a heat sink; an optical transceiver module including a housing having an external wall; and a thermal interface structure disposed between and in abutment with the external wall and with the heat sink, the thermal interface structure including a thermal interface material including a phase change material; and a polymer layer connected to the thermal interface material.

The thermal interface material may include a first side and a second side, the first side connected to the external wall of the housing and the second side connected to the polymer layer, and the polymer layer in abutment with the heat sink of the cage receptacle.

The thermal interface material may include a first side and a second side, the first side connected to the heat sink of the cage receptacle and the second side connected to the polymer layer, the polymer layer in abutment with the external wall of the housing.

The thermal interface structure may additionally include an adhesive layer connecting the polymer layer and the heat sink of the cage receptacle.

The thermal interface structure may additionally include an adhesive layer connecting the polymer layer and the external wall of the optical transceiver module.

The thermal interface material may additionally include an adhesive layer connecting the thermal interface material and the polymer layer.

The thermal interface material may additionally include a polymer matrix and at least one filler. The polymer layer may be formed of at least one polymer selected from the group consisting of polyester, polyimide, polysulfone, polycarbonate, polyamide, polyethylene terephthalate, polyethylene naphthalate, polybutylene terephthalate, polyvinylchloride, polylactic acid, polyurethane, polyacrylic, polyvinyl alcohol, polyethylene vinylacetate, polyethylene, polypropylene, polycyclopentadiene, polytetrafluoroethylene, polyvinylidene fluoride, polyvinyl fluoride, poly(ethylene-co-tetrafluoroethylene), poly(hexafluoropropylene-co-tetrafluoroethylene), polychlorotrifluoroethylene, polystyrene, polyether sulfone, polyether ether ketone, and combinations thereof. The polymer layer may have a thermal conductivity of at least 0.2 W/mK. The phase change material may have a melting point of 20° C. to 100° C.

In a further form thereof, the present disclosure provides an electronic component, including a cage receptacle including a heat sink; an optical transceiver module including a housing having an external wall; and a thermal interface structure disposed between and in abutment with the external wall and with the heat sink, the thermal interface structure including a thermal interface material including a phase change material; an adhesive surrounding a perimeter of the thermal interface material; and a polymer layer connected to the thermal interface material and the adhesive; wherein the thermal interface material and the adhesive each include a first side and a second side, each first side connected to the polymer layer and each second side connected to the heat sink of the cage receptacle; and wherein the polymer layer includes a first side and a second side, the first side connected to the thermal interface material and the adhesive, and the second side in abutment with the external wall of the optical transceiver module housing.

The thermal interface material may additionally include a polymer matrix and at least one filler. The phase change material may have a melting point of 20° C. to 100° C. The polymer layer may have a thermal conductivity of at least 0.2 W/mK.

BRIEF DESCRIPTION OF THE DRAWINGS

The above mentioned and other features and objects of this disclosure, and the manner of attaining them, will become more apparent and the disclosure itself will be better understood by reference to the following description of embodiments of the disclosure taken in conjunction with the accompanying drawings, wherein:

FIG. 4 is a sectional view of a first optical transceiver module and cage receptacle configuration;

FIG. 5 is a sectional view of a second optical transceiver module and cage receptacle configuration;

FIG. 6 is a sectional view of a third optical transceiver module and cage receptacle configuration, including the thermal interface structure of FIG. 3C;

FIG. 7 is a sectional view of a fourth optical transceiver module and cage receptacle configuration, including the thermal interface structure of FIG. 3C;

FIG. 8 is a sectional view showing a first step of an exemplary method for preparing a thermal interface structure;

FIG. 9 is a sectional view showing a second step of an exemplary method for preparing a thermal interface structure;

FIG. 10 is a sectional view showing a third step of an exemplary method for preparing a thermal interface structure; and FIG. 11 is a sectional view showing a fourth step of an exemplary method for preparing a thermal interface structure.

Figure 1:
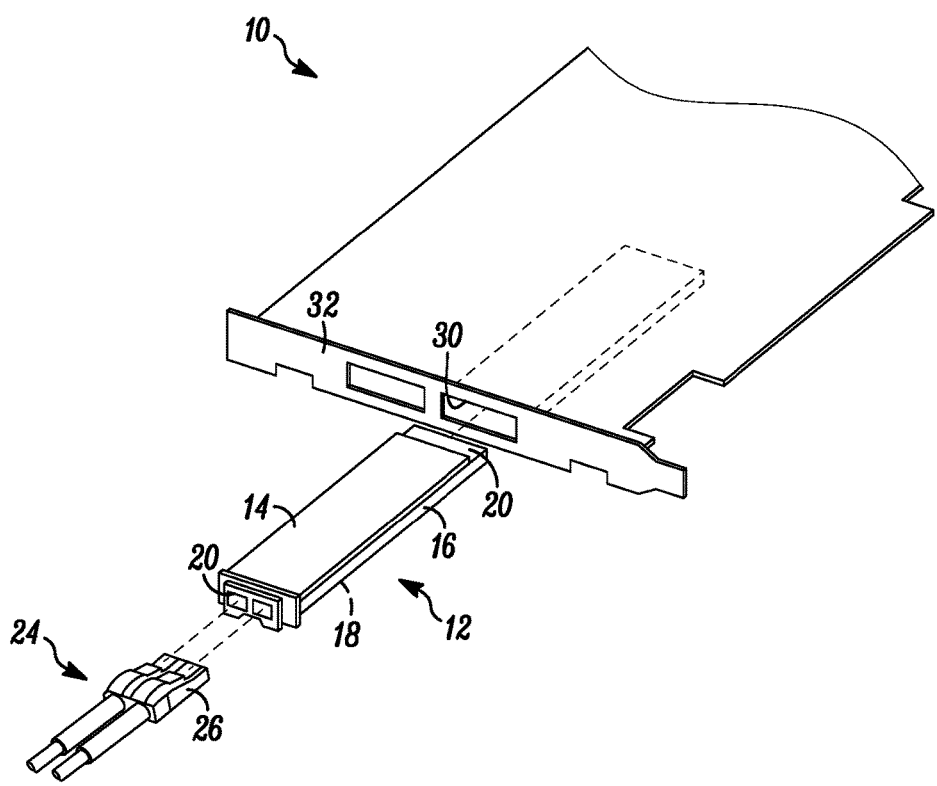
FIG. 1 is perspective view showing an optical transceiver module and an associated cage receptacle of an electronic device.

Corresponding reference characters indicate corresponding parts throughout the several views. Although the exemplifications set out herein illustrate an embodiment of the disclosure, the embodiment disclosed below is not intended to be exhaustive or to be construed as limiting the scope of the disclosure to the precise form disclosed.

DETAILED DESCRIPTION

The present disclosure provides a thermal interface structure for electronic devices, such as telecommunications or data networking hardware, that utilize optical transceiver modules which are inserted within cage receptacles of the electronic devices. In order to provide for efficient heat transfer, the thermal interface structure is disposed between, and in abutment with, the optical transceiver module and a heat sink associated with the cage receptacle. The thermal interface structure includes a thermal interface layer including a phase change material, and a polymer layer connected to the thermal interface layer.

I. Background

Referring to FIG. 1, an electronic component 10 is shown, which may be a device of telecommunications and/or data networking hardware, for example. Optical transceiver module 12 is removably connected to component 10 as described below, and includes a housing having a top wall 14, a pair of side walls 16, and a bottom wall 18, together with optical fiber interface 20 and one or more electrical connectors 22. An optical fiber cable 24 may include a terminal end 26 releasably received within interface 20 of optical transceiver module 12.

Figure 2:
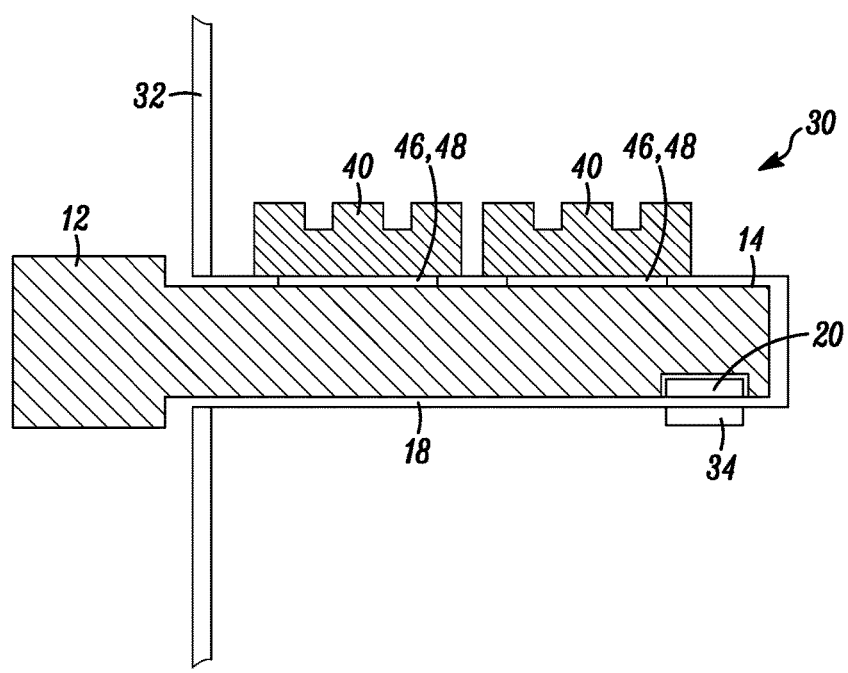
FIG. 2 is a sectional view through the cage receptacle, showing the optical transceiver module received within the cage receptacle.

In use, optical transceiver module 12 may be inserted within a cage receptacle 30 of component 10 by inserting transceiver module 12 through front bezel 32 of component 10. Referring additionally to FIG. 2, upon full insertion of transceiver module 12, electrical connectors 22 of transceiver module 12 engage electrical connectors 34 of component 10, which are associated with a circuit board and/or other hardware of component 10 to allow data transfer. One or more heat sinks 40 may be disposed within component 10 in alignment with an open upper portion of cage receptacle 30. Alternatively, one or more heat sinks 40 may be disposed in alignment with a side portion or lower portion of cage receptacle 30.

Typically, optical transceiver module 12 operates at a working temperature between about 45° C. and about 65° C. and therefore, there is a need to convey heat away from optical transceiver module 12.

As discussed in further detail below, when transceiver module 12 is received within cage receptacle 30, a thermal interface structure 46 may be disposed in abutting contact between the housing of transceiver module 12 and an adjacent heat sink 40 associated with cage receptacle 30 to facilitate dissipation of heat from transceiver module 12 to heat sink 40. As discussed in further detail below, the thermal interface structure 46 generally includes a thermal interface material (TIM) 48, a polymer layer 50, and an adhesive 52.

II. Thermal Interface Materials

The thermal interface material (TIM) 48 may be provided as a solid thermal interface layer, and generally includes a formula including one or more components such as a matrix, at least one filler, at least one phase change material, at least one coupling agent, and optional additives.

The thermal interface material 48 may have a thickness as little as 0.01 mm, 0.05 mm, or 0.1 mm, or as great as 1 mm, 2.0 mm, or 10.0 mm, or within any range defined between any two of the foregoing values, such as 0.01 to 10.0 mm, 0.05 to 2.0 mm, or 0.1 to 1 mm, for example. Generally, a higher thickness may potentially affect the total thermal impedance, and a lesser thickness may not be sufficient to mitigate the variation of the different surface roughness of the transceiver module 12 or the cage receptacle 30.

The thermal interface material 48 may have a thermal conductivity as little as 0.2 W/mK, 0.5 W/mK, 1 W/mK, or 2 W/mK, or as great as 4 W/mK, 6 W/mK, 10 W/mK or 500 W/mK, or within any range defined between any two of the foregoing values, such as 0.2 W/mK to 500 W/mK, 1 W/mK to 6 W/mK, or 2 W/mK to 10 W/mK, for example. The thermal conductivity may be determined according to ASTM D5470.

A. Matrix.

The matrix of the thermal interface material 48 may be a polymer material, which provides a matrix or scaffold for incorporating the thermally conductive fillers, and provides flowability when pressed under heat and pressure.

In one exemplary embodiment, the polymer matrix material comprises a hydrocarbon rubber compound or a blend of rubber compounds. Exemplary materials include saturated and unsaturated rubber compounds. In some embodiments, saturated rubbers may be less sensitive to thermal oxidation degradation than unsaturated rubber compounds. Exemplary saturated rubber compounds include ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene diol) and hydrogenated polyisoprene, polyolefin elastomer, or any other suitable saturated rubber, or blends thereof. In one embodiment, the polymer matrix material is a hydrogenated polybutadiene mono-ol, which may also be referred to as a hydroxyl-terminated ethylene butylene copolymer, specialty mono-ol.

In other embodiments, unsaturated rubbers may be used. Examples of unsaturated rubbers and rubber compounds are polybutadiene, polyisoprene, polystyrene-butadiene and other suitable unsaturated rubbers, blends thereof, or blends of saturated and unsaturated rubber compounds. If the rubber is unsaturated, in some embodiments the compound may undergo a hydrogenation process to rupture or remove at least some of the double bonds. As used herein, the phrase "hydrogenation process" means that an unsaturated organic compound is reacted with hydrogen by either a direct addition of hydrogen to some or all of the double bonds, resulting in a saturated product (addition hydrogenation), or by rupturing the double bond entirely, whereby the fragments further react with hydrogen (hydrogenolysis).

The rubber compounds may be "self-crosslinkable" in that they could crosslink intermolecularly with other rubber molecules or intramolecularly with themselves, depending on the other components of the composition. The intramolecular and intermolecular cross-linking with the rubber compounds may be facilitated by optional cross-linking agents, as discussed further below.

In some exemplary embodiments, the thermal interface material 48 may include the polymer matrix material, such as one or more of any of those listed above, in an amount as little as 1 wt. %, 3 wt. %, 5 wt. %, 10 wt. %, as great as 15 wt. %, 25 wt. %, 50 wt. %, 75 wt. %, or within any range defined between any two of the foregoing values, based on the total weight of the thermal interface material 48.

In a more preferred embodiment, the thermal interface material 48 may include the polymer matrix material, such as one or more of any of those listed above, in an amount as little as 1 wt. %, 2 wt. %, or 3 wt. %, as great as 7 wt. %, 8 wt. %, or 10 wt. %, or within any range defined between any two of the foregoing values, such as 1 wt. % to 10 wt. %, 2 wt. % to 8 wt. %, or 3 wt. % to 7 wt. %, for example, based on the total weight of the thermal interface material 48.

B. Filler.

The thermally conductive filler may include a primary thermally conductive filler and may also include one or more secondary thermally conductive fillers. In one exemplary embodiment, the primary thermally conductive filler has a particle size larger than a particle size of the secondary thermally conductive filler.

The primary and secondary thermally conductive fillers may be different sized particles of the same material, or differently sized particles of different materials. The thermally conductive filler may be a metal, such as aluminum, copper, silver, zinc, nickel, tin, indium, or lead. In a more particular embodiment, the first thermally conductive filler is aluminum.

In one exemplary embodiment, the thermally conductive filler includes particles having a size as little as 1 micron 2 microns, 3 microns, 5 microns, 8 microns, as great as 10 microns, 12 microns, 15 microns, 20 microns, 25 microns, 50 microns, 100 microns, or within any range defined between any two of the foregoing values.

In one more particular embodiment, each of the primary and secondary conductive fillers have a particle size from about 1 to about 25 microns. In one more particular embodiment, the primary thermally conductive filler has a particle size from about 3 to about 5 microns. In one more particular embodiment, the secondary thermally conductive filler has a particle size from about 3 to about 15 microns. In one more particular embodiment, the secondary thermally conductive filler has a particle size from about 8 to about 12 microns. In one more particular embodiment, the primary thermally conductive filler has a particle size of about 3 microns. In one more particular embodiment, the secondary thermally conductive filler has a particle size of about 10 microns.

The thermal interface material 48 may comprise a total filler content in an amount as little as 10 wt. %, 25 wt. %, 50 wt. %, 75 wt. %, 80 wt. %, 85 wt. %, as great as 90 wt. %, 92 wt. %, 95 wt. %, 97 wt. %, 98 wt. %, 99 wt. %, or within any range defined between any two of the foregoing values, based on the total weight of the thermal interface material 48.

In a more preferred embodiment, the thermal interface material 48 may comprise a total filler content in an amount as little as 80 wt. %, 85 wt. %, or 90 wt. %, as great as 95 wt. %, 97 wt. %, or 98 wt. %, or within any range defined between any two of the foregoing values, such as 80 wt. % to 98 wt. %, 85 wt. % to 97 wt. %, or 90 wt. % to 95 wt. %, for example, based on the total weight of the thermal interface material 48.

C. Phase Change Material.

In some exemplary embodiments, the thermal interface material 48 includes one or more phase change materials. A phase change material is a material having a melting point or melting point range at or below the operating temperature of a portion of an electronic device in which the thermal interface material 48 is to be used. An exemplary phase change material is a wax, such as paraffin wax. Paraffin waxes are a mixture of solid hydrocarbons having the general formula $C_nH_{2n+2}$ and having melting points in the range of about 20° C. to 100° C. Polymer waxes include polyethylene waxes and polypropylene waxes, and typically have a range of melting points from about 40° C. to 160° C. Other exemplary phase change materials include low melting alloys, such as Wood's metal, Field's metal, or a metal or alloy having a melting point between about 20° C. and 90° C.

In some embodiments, the amount of phase change material can be used to can adjust the hardness of the thermal interface material 48. For example, in some embodiments wherein the loading of the phase change material is low, the composition may be in the form of a soft gel, and in some embodiments wherein the loading of the phase change material is high, the composition may be a hard solid.

An exemplary wax having an ASTM D1321 needle penetration value less than 70 includes TAC wax, available from The International Group, Inc., and RT44HC, available from Hangzhou Ruhr Tech. The hardness of a wax may be characterized by a needle penetration value, such as a needle penetration value determined in accordance with ASTM D1321 at 25° C., the disclosures of which are hereby incorporated by reference in their entirety.

The thermal interface material 48 may comprise the one or more phase change materials in an amount as little as 0.1 wt. %, 1 wt. %, 5 wt. %, 10 wt. %, as great as 15 wt. %, 25 wt. %, 50 wt. %, 75 wt. %, or within any range defined between any two of the foregoing values, based on the total weight of the thermal interface material 48.

In a more preferred embodiment, the thermal interface material 48 may comprise the one or more phase change materials in an amount as little as 0.1 wt. %, 0.2 wt. %, or 0.5 wt. %, as great as 1 wt. %, 2 wt. %, or 3 wt. %, or within any range defined between any two of the foregoing values, such as 0.1 wt. % to 3 wt. %, 0.2 wt. % to 2 wt. %, or 0.5 wt. % to 1 wt. %, based on the total weight of the thermal interface material 48.

D. Coupling Agent.

In some exemplary embodiments, the thermal interface material 48 includes one or more coupling agents. In some exemplary embodiments, inclusion of a coupling agent may improve thermal properties, such as properties at relatively high temperatures. Exemplary coupling agents include titanate coupling agents, such as those disclosed in US Patent Application Publication 2011/0308782, the disclosure of which is hereby incorporated by reference in its entirety. Exemplary coupling agents include: titanium IV 2,2 (bis 2-propenolatomethyl)butanolato, tris(dioctyl)pyrophosphato-O; zirconium IV 2,2 (bis 2-propenolatomethyl)butanolato, tris(diisooctyl)pyrophosphato-O; titanium IV 2-propanolato, tris(dioctyl)-pyrophosphato-O) adduct with 1 mole of diisooctyl phosphite; titanium IV bis(dioctyl)pyrophosphato-O, oxoethylenediolato, (Adduct), bis(dioctyl) (hydrogen)phosphite-O; titanium IV bis(dioctyl)pyrophosphato-O, ethylenediolato (adduct), bis(dioctyl)hydrogen phosphite; and zirconium IV 2,2-bis(2-propenolatomethyl) butanolato, cyclo di[2,2-(bis 2-propenolatomethyl) butanolato], pyrophosphato-O,O. In one exemplary embodiment, the coupling agent is titanium IV 2, 2 (bis 2-propenolatomethyl) butanolato, tris(dioctyl)pyrophosphato-O.

In some exemplary embodiments, the thermal interface material 48 may include the one or more coupling agents in an amount as little as 0.1 wt. %, 0.3 wt. %, 0.5 wt. %, as great as 1 wt. %, 2 wt. %, 3 wt. %, 5 wt. %, or within any range defined between any two of the foregoing values, such as 0.1 wt. % to 5 wt. %, 0.3 wt. % to 3 wt. %, or 0.5 wt. % to 1 wt. %, for example, based on the total weight of the thermal interface material 48.

E. Additives.

In some exemplary embodiments, the thermal interface material 48 includes one or more additives. Exemplary additives include antioxidants, ion scavengers, and crosslinkers.

Exemplary antioxidants include phenolic-type antioxidants, amine-type antioxidants, or any other suitable type of antioxidant or combinations thereof. In some exemplary embodiments, the thermal interface material 48 may include the one or more antioxidants in an amount as little as 0.1 wt. %, 0.5 wt. %, 1 wt. %, or as great as 1.5 wt. %, 2 wt. %, 5 wt. %, 10 wt. %, or within any range defined between any two of the foregoing values, such as between 0.1 wt. % and 10 wt. %, 0.5 wt. % to 5 wt. %, or 1 wt. % to 1.5 wt. %, for example, based on the total weight of the thermal interface material 48.

Exemplary ion scavengers are disclosed in PCT application number PCT/CN2014/081724, the disclosure of which is hereby incorporated by reference in its entirety. In some exemplary embodiments, the thermal interface material 48 may comprise the one or more ion scavengers in an amount as little as 0.1 wt. %, 0.5 wt. %, 1 wt. % as great as 1.5 wt. %, 2 wt. %, 5 wt. %, 10 wt. %, or within any range defined between any two of the foregoing values, such as between 0.1 wt. % to 10 wt. %, 0.5 wt. % to 5 wt. %, or 1 wt. % to 2 wt. %, or example, based on the total weight of the thermal interface material 48.

Exemplary crosslinkers are disclosed in U.S. Pat. No. 7,244,491, the disclosure of which is hereby incorporated by reference in its entirety. Exemplary crosslinkers include alkylated melamine resins. In some exemplary embodiments, the thermal interface material 48 may comprise the one or more crosslinkers in an amount as little as 0.1 wt. %, 0.5 wt. %, 1 wt. % as great as 1.5 wt. %, 2 wt. %, 5 wt. %, 10 wt. %, or within any range defined between any two of the foregoing values, such as between 0.1 wt. % to 10 wt. %, 0.5 wt. % to 5 wt. %, or 1 wt. % to 2 wt. %, or example, based on the total weight of the thermal interface material 48.

III. Polymer Layer

The thermal interface structure 46 may also include a polymer layer 50 associated with the thermal interface material 48. The polymer layer is in the form of a heat conductive polymer or plastic, based on one or more of polyester, polyimide, polysulfone, polycarbonate, polyamide, polyethylene terephthalate, polyethylene naphthalate, polybutylene terephthalate, polyvinylchloride, polylactic acid, polyurethane, polyacrylic, polyvinyl alcohol, polyethylene vinylacetate, polyethylene, polypropylene, polycyclopentadiene, polytetrafluoroethylene, polyvinylidene fluoride, polyvinyl fluoride, poly(ethylene-co-tetrafluoroethylene), poly(hexafluoropropylene-co-tetrafluoroethylene), polychlorotrifluoroethylene, polystyrene, polyether sulfone, or polyether ether ketone, or combinations thereof, for example.

The polymer layer may be in the form of a multi-layer laminate including multiple layers of a single plastic, or multiple layers of differing plastics, selected from those listed above. The polymer layer may further comprise one or more conductive fillers, such as those described above, to enhance the thermal conductivity of the film. The polymer layer may further comprise one or more other agents, such as lubricants and/or pigments.

Exemplary plastic films include HM, HPD, PPY, PAC, PET, PP, PTD, and PTS, all available from Guofeng; OA-1, OA-2, BOA, TOA, LX, N-CO, RS, RCO, CO2, PGLS, VILBO, and EASYTEX, all available from FSPG; Lumirror™, Torelina™, Mictron™, TORAYFAN™, RAYFAN™, TOYOFLON™, and TORETEC™, all available from Toray; PYLEN®, ESTER®, ESPET®, HARDEN®, and LIX®, all available from TOYOBO; Mylar®, Melinex®, and Teonex®, all available from Dupont Teijin Films; Autoflex®, Autostat®, and Autoflex®, all available from Autotype; Teflon®, Tefzel™, and Tedlar®, all available from Dupont; LEXAN™, VALOX™, ULTEM™, and NORYL™, all available from SABIC; Makrolon®, Bayblend®, and Makroblend®, all available from Covestro; Aclar® and Halar®, both available from Honeywell; Solef®, available from Solvay; FLONFILM™, available from Polyflon; Kynar®, available from ARKEMA. Further exemplary thermally conductive plastic films are polyimide, including Kapton®, available from Dupont, UPILEX®, available from UBE, APICAL™, available from Kaneka, CPI™, available from SKC Kolon, and KYPI, available from Kying.

Preferably, the thermally conductive plastic film has a thermal conductivity above 0.2 W/mK, as determined according to ASTM D5470. The thermally conductive plastic film may also have a tensile strength above 100 MPa, as determined according to ASTM D882.

The thickness of the polymer layer 50 will affect the overall thermal resistance of the thermal interface structure 46 because the thermal conductivity of the polymer film is not high as that of the thermal interface material 48, so it is generally desired to minimize the thickness of the polymer film while also maintaining a suitable thickness to provide structural reliability of the film and prevent damage to the film during insertion and removal of the optical transceiver module 12 with respect to the cage receptacle 30. In this respect, the thickness of the polymer film may be as little as 5 microns, 10 microns, or 15 microns, or as great as 50 microns, 100 microns, or 2000 microns, or may be within any range defined between any two of the foregoing values, such as 5 microns to 2000 microns, 10 microns to 100 microns, or 15 microns to 50 microns, for example.

In use, the polymer layer 50 releasably engages or abuts an adjacent surface, such as the surface of a heat sink 40 or a wall of the optical transceiver module 12, and provides frictional protection to the thermal interface material 48 of the thermal interface structure 46.

IV. Adhesive

The thermal interface structure 46 may also include an adhesive 52 to provide adhesion between the polymer layer 50 and the thermal interface material 48 and/or between the thermal interface structure 46 and the walls of the optical transceiver module 12 or heat sink 40 of the cage receptacle 30. The adhesive may be based on an acrylic resin, polyurethane, silicone, polyolefin, phenolic resin, melamine resin or epoxy resin system, for example. The adhesive may be based on a one component system or on a two component system. The adhesive may be a solvent based adhesive (organic solvent based or water based, for example), radiation curing adhesive (ultraviolet curing, for example), hot-melt adhesive, moisture curing adhesive, anaerobic adhesive, or a combined system incorporating two or more of the foregoing characteristics. The adhesive may be a pressure sensitive adhesive (PSA), and the adhesive may be applied via brush, dispensing, spray coating, screen-printing, stencil-printing, or laminating, for example. Exemplary PSAs are commercially available from 3M, Henkel, Dow Corning, and Dupont.

V. Exemplary Configurations

Figure 3A:
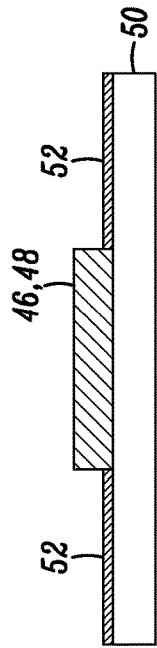
FIG. 3A is a sectional view of a first exemplary thermal interface structure.
Figure 3B:
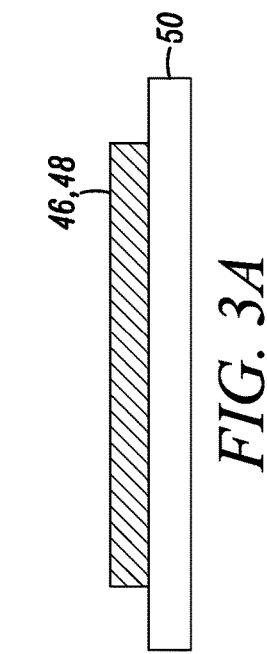
FIG. 3B is a sectional view of a second exemplary thermal interface structure.

Exemplary configurations of thermal interface structures 46 are shown in FIGS. 3A-3E. Referring to FIG. 3A, a first configuration of thermal interface structure 46 is shown, which generally includes a thermal interface material 48 attached to a polymer layer 50. Referring to FIG. 3B, thermal interface material 48 is disposed between, and attached to, a pair of opposite lower and upper polymer layers 50.

Figure 3C:
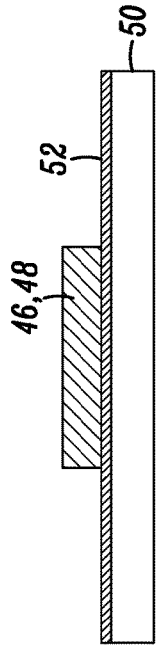
FIG. 3C is a sectional view of a third exemplary thermal interface structure.

As shown in FIG. 3C, one side of thermal interface material 48 is surrounded by polymer layer 50, and an adhesive layer 52 is disposed around the perimeter of thermal material 48 to secure polymer layer 50 to thermal interface material 48 and, as shown in FIGS. 6 and 7 below, to also secure the thermal interface structure 46 to optical transceiver module 12 (FIG. 6) or to heat sink 40 of cage receptacle 30 (FIG. 7).

Figure 3D:
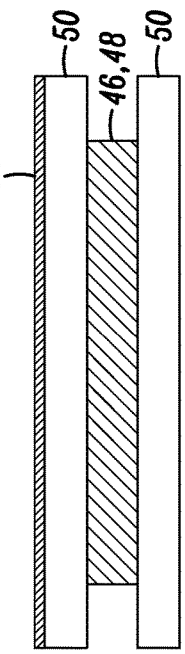
FIG. 3D is a sectional view of a fourth exemplary thermal interface structure.

In FIG. 3D, thermal interface material 48 is secured via an adhesive layer 52 to an underlying polymer layer 50, with the adhesive layer 52 extending between and connecting the thermal interface material 48 and the polymer layer 50.

Figure 3E:
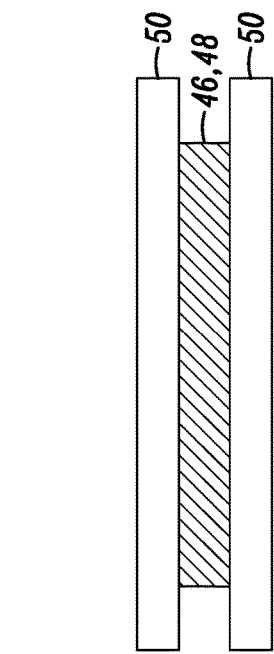
FIG. 3E is a sectional view of a fifth exemplary thermal interface structure.

Referring to FIG. 3E, thermal interface material 48 is disposed between lower and upper polymer layers 50 similar to FIG. 3B, and an adhesive layer 52 is provided to one of the lower or upper polymer layers 50, for example, the upper polymer as shown in FIG. 3E.

Referring to FIGS. 4-7, exemplary configurations are shown for associating the thermal interface materials of the present disclosure with optical transceiver modules and cage receptacles of an electronic device.

Referring to FIG. 4, cage receptacle 30 includes both upper and lower heat sinks 40 associated therewith, as described above with reference to FIGS. 1 and 2. Optical transceiver module 20 includes thermal interface structures 46 attached to each of its opposite top and bottom walls 14 and 18 such that, when the optical transceiver module 20 is inserted within the cage receptacle 30, the thermal interface structures 46 are in abutting, heat conducting engagement with the upper and lower heat sinks 40 for transferring heat away from optical transceiver modules 20 in use, with the heat in turn transferred through heat sinks 40 for dissipation into the interior of the electronic device or outwardly of the electronic device via suitable fans or other cooling systems, for example.

In FIG. 5, a similar arrangement is shown, in which the thermal interface structures 46 are connected to the heat sinks 40 and are disposed within the cage receptacle 30 with thermal interface materials in abutting, heat conducting engagement with the top and bottom walls 14 and 18 of optical transceiver module 20 for transferring heat away from optical transceiver module 20 in use.

In FIGS. 6 and 7, exemplary configurations are shown which include the thermal interface structure 46 shown in FIG. 3C. In FIG. 6, the cage receptacle 30 includes only a single heat sink 40 and the optical transceiver module 20 includes only a single thermal interface structure 46 on one of its walls, such as top wall 14, which abuts heat sink 40 in use. In FIG. 7 a similar arrangement is shown, wherein the cage receptacle 30 includes only a single heat sink 40, with a single thermal interface structure 46 attached to heat sink and abutting top wall 14 of optical transceiver module 20 in use.

Referring to FIGS. 8-11, one exemplary method for forming the thermal interface structure is shown. Referring to FIG. 8, one or more layers of thermal interface material 48 may be pressed onto the polymer layer 50 via a rolling process using a silicone rubber roller 54, for example, in which a bottom release liner 56 is first removed from the layers of thermal interface material 48 to allow same to be pressed onto the polymer layer 50 via the roller. Thereafter, an opposite release liner 58 may be removed from the layers of thermal interface material 48 to expose the upper surface of the thermal interface material 48.

Referring to FIG. 9, adhesive layer 52 may be printed onto polymer layer 50 around the layers of thermal interface material 48 in order to more fully secure the layers of thermal interface material 48 to the underlining polymer layer 50.

Thereafter, as shown in FIG. 10, a release liner 60 may be applied to the upper surfaces of the layers of thermal interface material 48 and the exposed adhesive layers 52 to protect same during shipment and storage, for example. Referring to FIG. 11, individual layers of thermal interface materials 48 may be cut to a final size wherein, to install the thermal interface materials 48 onto an associated optical receiver module 20 or heat sink 40 within a cage receptacle 30, for example, the release liner 60 is removed, followed by securing the thermal interface material 48 to the optical transceiver module 20 or heat sink 40 of the cage receptacle 30 as described above with respect to FIGS. 4-7.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

EXAMPLES

Example 1

Preparation of Thermal Interface Material

The release liner was peeled away from one side of a PTIM 3180 pad (0.25 mm, 38 mm width, supplied by Honeywell International Inc.) and the pad was laminated to a thermally conductive polyimide film (thermal conductivity 0.36 W/mK, thickness 25 microns) using a silicone roller at room temperature. Then, the release layer was peeled away from the other side of the pad and the pad was trimmed into sections with 4 mm gaps therebetween. A pressure sensitive adhesive (based on a copolymer of vinyl acetate and acrylic ester) was printed on the exposed portions of the polyimide film that were not covered by the pad. A release liner (PET liner, supplied from NIPPA) was laminated onto the exposed pads and adhesive to protect the thermal interface material and adhesive. The material was then cut into individual portions each having a size of 42×66 mm with 2 mm of exposed adhesive width along each edge.

Example 2

Thermal and Reliability Testing

The release liner of the thermal interface material of Example 1 above was peeled away, and the thermal interface material was pasted onto a thermal interface testing machine (supplied from Analysis Tech Company), with the exposed thermal interface side pasted on the hot surface and the polyimide film side in contact with the cooling plate. The initial thermal impedance was 3.42° C. cm$^2$/W. Then, an aluminum plate was rubbed back and forth on the polyimide film side 100 times under a pressure of 45 psi at room temperature. Then, the polyimide side was again contacted with the cooling plate, and the thermal impedance was found to decrease by 5% over the initial reading.

While this disclosure has been described as having a preferred design, the present disclosure can be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains and which fall within the limits of the appended claims.

What is claimed is:
1. An electronic component, comprising:
   a cage receptacle including a heat sink;
   an optical transceiver module including a housing having an external wall; and
   a thermal interface structure disposed between and in abutment with the external wall and with the heat sink, the thermal interface structure comprising:
      a solid thermal interface material including a polymer matrix, a phase change material, and at least one filler present in a total amount of 85 wt. % to 97 wt. %, based on a total weight of the thermal interface material;

a polymer layer connected to the thermal interface material; and wherein the thermal interface material includes a first side and a second side, the first side connected to the external wall of the housing and the second side connected to the polymer layer, and the polymer layer in abutment with the heat sink of the cage receptacle.

2. An electronic component, comprising:

a cage receptacle including a heat sink;

an optical transceiver module including a housing having an external wall; and a thermal interface structure disposed between and in abutment with the external wall and with the heat sink, the thermal interface structure comprising:

a solid thermal interface material including a polymer matrix, a phase change material, and at least one filler present in a total amount of 85 wt. % to 97 wt. %, based on a total weight of the thermal interface material;

a polymer layer connected to the thermal interface material; and wherein the thermal interface material includes a first side and a second side, the first side connected to the heat sink of the cage receptacle and the second side connected to the polymer layer, the polymer layer in abutment with the external wall of the housing.

3. The electronic component of claim 1, wherein the thermal interface structure additionally includes an adhesive layer connecting the polymer layer and the heat sink of the cage receptacle.

4. The electronic component of claim 2, wherein the thermal interface structure additionally includes an adhesive layer connecting the polymer layer and the external wall of the optical transceiver module.

5. The electronic component of claim 1, wherein the polymer layer is formed of at least one polymer selected from the group consisting of polyester, polyimide, polysulfone, polycarbonate, polyamide, polyethylene terephthalate, polyethylene naphthalate, polybutylene terephthalate, polyvinylchloride, polylactic acid, polyurethane, polyacrylic, polyvinyl alcohol, polyethylene vinylacetate, polyethylene, polypropylene, polycyclopentadiene, polytetrafluoroethylene, polyvinylidene fluoride, polyvinyl fluoride, poly(ethylene-co-tetrafluoroethylene), poly(hexafluoropropylene-co-tetrafluoroethylene), polychlorotrifluoroethylene, polystyrene, polyether sulfone, polyether ether ketone, and combinations thereof.

6. The electronic component of claim 1, wherein the polymer layer has a thermal conductivity of at least 0.2 W/mK.

7. The electronic component of claim 1, wherein the phase change material has a melting point of 20° C. to 100° C.

8. An electronic component, comprising:

a cage receptacle including a heat sink;

an optical transceiver module including a housing having an external wall; and a thermal interface structure disposed between and in abutment with the external wall and with the heat sink, the thermal interface structure comprising:

a solid thermal interface material including a polymer matrix, a phase change material, and at least one filler present in a total amount of 85 wt. % to 97 wt. %, based on a total weight of the thermal interface material;

an adhesive surrounding a perimeter of the thermal interface material; and a polymer layer connected to the thermal interface material and the adhesive;

wherein the thermal interface material and the adhesive each include a first side and a second side, each first side connected to the polymer layer and each second side connected to the heat sink of the cage receptacle; and wherein the polymer layer includes a first side and a second side, the first side connected to the thermal interface material and the adhesive, and the second side in abutment with the external wall of the optical transceiver module housing.

9. The electronic component of claim 8, wherein the phase change material has a melting point of 20° C. to 100° C.

10. The electronic component of claim 8, wherein the polymer layer has a thermal conductivity of at least 0.2 W/mK.

11. The electronic component of claim 2, wherein the polymer layer is formed of at least one polymer selected from the group consisting of polyester, polyimide, polysulfone, polycarbonate, polyamide, polyethylene terephthalate, polyethylene naphthalate, polybutylene terephthalate, polyvinylchloride, polylactic acid, polyurethane, polyacrylic, polyvinyl alcohol, polyethylene vinylacetate, polyethylene, polypropylene, polycyclopentadiene, polytetrafluoroethylene, polyvinylidene fluoride, polyvinyl fluoride, poly(ethylene-co-tetrafluoroethylene), poly(hexafluoropropylene-co-tetrafluoroethylene), polychlorotrifluoroethylene, polystyrene, polyether sulfone, polyether ether ketone, and combinations thereof.

12. The electronic component of claim 2, wherein the polymer layer has a thermal conductivity of at least 0.2 W/mK.

13. The electronic component of claim 2, wherein the phase change material has a melting point of 20° C. to 100° C.

14. The electronic component of claim 1, wherein the polymer layer comprises a polyimide.

15. The electronic component of claim 2, wherein the polymer layer comprises a polyimide.

16. The electronic component of claim 8, wherein the polymer layer comprises a polyimide.

17. The electronic component of claim 1, wherein the phase change material includes at least one wax.

18. The electronic component of claim 2, wherein the phase change material includes at least one wax.

19. The electronic component of claim 8, wherein the phase change material includes at least one wax.

* * * * *